United States Patent
Soliman

(10) Patent No.: US 10,171,053 B2
(45) Date of Patent: Jan. 1, 2019

(54) APPARATUS AND METHODS FOR POWER AMPLIFIERS WITH AN INJECTION-LOCKED OSCILLATOR DRIVER STAGE

(71) Applicant: SKYWORKS SOLUTIONS, INC., Woburn, MA (US)

(72) Inventor: Yasser Khairat Soliman, Kanata (CA)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 58 days.

(21) Appl. No.: 15/584,463

(22) Filed: May 2, 2017

(65) Prior Publication Data

US 2017/0324388 A1 Nov. 9, 2017

Related U.S. Application Data

(60) Provisional application No. 62/332,127, filed on May 5, 2016.

(51) Int. Cl.
| | |
|---|---|
| *H03F 3/72* | (2006.01) |
| *H03B 5/08* | (2006.01) |
| *H03G 3/20* | (2006.01) |
| *H03B 9/12* | (2006.01) |
| *H03B 5/12* | (2006.01) |
| *H03F 1/02* | (2006.01) |
| *H03F 3/193* | (2006.01) |

(Continued)

(52) U.S. Cl.
CPC ........... *H03F 3/72* (2013.01); *H03B 5/08* (2013.01); *H03B 5/1215* (2013.01); *H03B 9/12* (2013.01); *H03F 1/0227* (2013.01); *H03F 3/193* (2013.01); *H03F 3/245* (2013.01); *H03G 3/20* (2013.01); *H03B 2200/0074* (2013.01); *H03F 2200/411* (2013.01); *H03F 2200/516* (2013.01); *H03F 2203/7239* (2013.01); *H03G 3/3042* (2013.01)

(58) Field of Classification Search
CPC .................................. H03F 3/72; H03B 5/08
See application file for complete search history.

(56) References Cited

U.S. PATENT DOCUMENTS 5,251,331 A * 10/1993 Schwent ............... H03G 3/3047
330/297
5,438,684 A * 8/1995 Schwent ............... H03F 1/0277
330/124 R (Continued)

OTHER PUBLICATIONS

Törmänen et al. "A 13dBm 60GHz-Band Injection Locked PA with 36% PAE in 65nm CMOS" Electrical and Information Technology, Lund University, Proceedings of the Asia-Pacific Microwave Conference 2011, 4 pages.

*Primary Examiner* — Patricia T Nguyen
(74) *Attorney, Agent, or Firm* — Knobbe Martens Olson & Bear LLP

(57) ABSTRACT

Apparatus and methods for power amplifiers with an injection-locked oscillator driver stage are provided herein. In certain configurations, a multi-mode power amplifier includes a driver stage implemented using an injection-locked oscillator and an output stage having an adjustable supply voltage that changes based on a mode of the multi-mode power amplifier. By implementing the multi-mode power amplifier in this manner, the multi-mode power amplifier exhibits excellent efficiency, including when the voltage level of the adjustable supply voltage is relatively low.

20 Claims, 11 Drawing Sheets

(51) Int. Cl.
*H03F 3/24* (2006.01)
*H03G 3/30* (2006.01)

(56) References Cited

U.S. PATENT DOCUMENTS

| | | | |
|---|---|---|---|
| 6,606,483 B1* | 8/2003 | Baker | H03F 1/0277 |
| | | | 455/126 |
| 7,409,192 B2* | 8/2008 | Lombardi | H03C 3/0966 |
| | | | 455/112 |
| 2008/0030282 A1 | 2/2008 | Maget et al. | |
| 2011/0003571 A1 | 1/2011 | Park et al. | |
| 2012/0049894 A1* | 3/2012 | Berchtold | G11C 27/024 |
| | | | 327/94 |
| 2012/0074990 A1 | 3/2012 | Sornin | |
| 2012/0224407 A1 | 9/2012 | Aleksic et al. | |
| 2012/0262239 A1 | 10/2012 | Taghivand et al. | |
| 2013/0241662 A1 | 9/2013 | Aleksic et al. | |
| 2014/0043105 A1 | 2/2014 | Zerbe et al. | |
| 2014/0104010 A1 | 4/2014 | Chen et al. | |
| 2014/0266480 A1 | 9/2014 | Li et al. | |
| 2015/0091658 A1 | 4/2015 | Shima et al. | |
| 2015/0097031 A1 | 4/2015 | Yang et al. | |
| 2015/0097629 A1 | 4/2015 | Chong | |
| 2015/0270943 A1 | 9/2015 | Liu et al. | |
| 2015/0333760 A1 | 11/2015 | Zerbe et al. | |
| 2016/0079993 A1 | 3/2016 | Zerbe et al. | |
| 2016/0099720 A1 | 4/2016 | Bashir et al. | |
| 2016/0112054 A1 | 4/2016 | Gonzalez et al. | |
| 2016/0226496 A1 | 8/2016 | Aleksic et al. | |
| 2016/0337117 A1 | 11/2016 | Liu et al. | |
| 2016/0365994 A1 | 12/2016 | Chen et al. | |
| 2017/0040941 A1 | 2/2017 | Chatwin | |
| 2017/0117907 A1 | 4/2017 | Grollitsch | |
| 2017/0207791 A1 | 7/2017 | Zerbe et al. | |

* cited by examiner

APPARATUS AND METHODS FOR POWER AMPLIFIERS WITH AN INJECTION-LOCKED OSCILLATOR DRIVER STAGE

CROSS-REFERENCE TO RELATED APPLICATIONS

This application claims the benefit of priority under 35 U.S.C. § 119(e) of U.S. Provisional Patent Application No. 62/332,127, filed May 5, 2016 and titled "APPARATUS AND METHODS FOR POWER AMPLIFIERS WITH AN INJECTION-LOCKED OSCILLATOR DRIVER STAGE," which is herein incorporated by reference in its entirety.

BACKGROUND

Field

Embodiments of the invention relate to electronic systems, and in particular, to radio frequency (RF) electronics.

Description of the Related Technology

Power amplifiers are used in radio frequency (RF) communication systems to amplify RF signals for transmission via antennas. It can be important to manage the power of RF signal transmissions to prolong battery life and/or provide a suitable transmit power level.

Examples of RF communication systems with one or more power amplifiers include, but are not limited to mobile phones, tablets, base stations, network access points, laptops, and wearable electronics. For example, in systems that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 450 MHz to about 6 GHz for certain communications standards.

SUMMARY

In certain embodiments, the present disclosure relates to a multi-mode power amplifier. The multi-mode power amplifier includes a driver stage including an injection-locked oscillator configured to receive a radio frequency input signal and to generate an injection-locked radio frequency signal and an output stage configured to amplify the injection-locked radio frequency signal to generate a radio frequency output signal. The output stage is configured to receive power from an adjustable supply voltage. The multi-mode power amplifier further includes a supply control circuit configured to control a voltage level of the adjustable supply voltage based on a mode of the multi-mode power amplifier.

In some embodiments, the injection-locked oscillator includes an output balun configured to provide a differential to singled-ended signal conversion.

In a number of embodiments, the driver stage is powered by a substantially fixed supply voltage.

In various embodiments, the mode of the multi-mode power amplifier is selectable between two or more power modes including a high power mode in which the adjustable supply voltage is greater than the substantially fixed supply voltage and a low power mode in which the adjustable supply voltage is less than the substantially fixed supply voltage.

According to several embodiments, the radio frequency input signal is a modulated signal having a substantially constant signal envelope.

In some embodiments, the radio frequency input signal is a single-ended input signal, and the injection-locked oscillator includes an input transformer configured to convert the single-ended input signal to a differential input signal.

In accordance with a number of embodiments, the injection-locked oscillator includes a negative transconductance circuit electrically connected to an inductor-capacitor tank, and the negative transconductance circuit configured to provide energy to the inductor-capacitor tank to maintain oscillations.

In various embodiments, the negative transconductance circuit includes a pair of cross-coupled field-effect transistors.

In according with some embodiments, the injection-locked oscillator further includes a signal injecting circuit configured to provide signal injection to the inductor-capacitor tank based on the radio frequency input signal.

In certain embodiments the present disclosure relates to a method of radio frequency signal amplification. The method includes generating an injection-locked radio frequency signal from a radio frequency input signal using an injection-locked oscillator of a multi-mode power amplifier, amplifying the injection-locked radio frequency signal using an output stage of the multi-mode power amplifier, powering the output stage using an adjustable supply voltage, and controlling a voltage level of the adjustable supply voltage based on a mode of the multi-mode power amplifier using a supply control circuit.

In some embodiments, the method further includes providing a differential to singled-ended signal conversion at an output of the driver stage using an output balun.

In various embodiments, the method further includes powering the driver stage using a substantially fixed supply voltage.

In several embodiments, the method further includes providing a modulated signal having a substantially constant signal envelope to an input of the driver stage.

In a number of embodiments, the method further includes injection locking an inductor-capacitor tank of the injection-locked oscillator to the radio frequency input signal.

In according with some embodiments, the method further includes providing energy to the inductor-capacitor tank to maintain oscillations using a negative transconductance circuit.

In certain embodiments, the present disclosure relates to a packaged module. The packaged module includes a package substrate and a semiconductor die attached to the package substrate. The semiconductor die includes a multi-mode power amplifier including a driver stage including an injection-locked oscillator configured to receive a radio frequency input signal and to generate an injection-locked radio frequency signal, and an output stage configured to amplify the injection-locked radio frequency signal to generate a radio frequency output signal. The output stage is configured to receive power from an adjustable supply voltage having a voltage level that changes based on a mode of the multi-mode power amplifier.

In some embodiments, the semiconductor die further includes a low noise amplifier and a switch electrically connected to the low noise amplifier and to the multi-mode power amplifier.

In various embodiments, the injection-locked oscillator includes a negative transconductance circuit electrically connected to an inductor-capacitor tank, and the negative transconductance circuit configured to provide energy to the inductor-capacitor tank to maintain oscillations.

In according with a number of embodiments, the injection-locked oscillator further includes a signal injecting circuit configured to provide signal injection to the inductor-capacitor tank based on the radio frequency input signal.

In several embodiments, the semiconductor die is a silicon-on-insulator die.

DETAILED DESCRIPTION OF EMBODIMENTS

Figure 1:
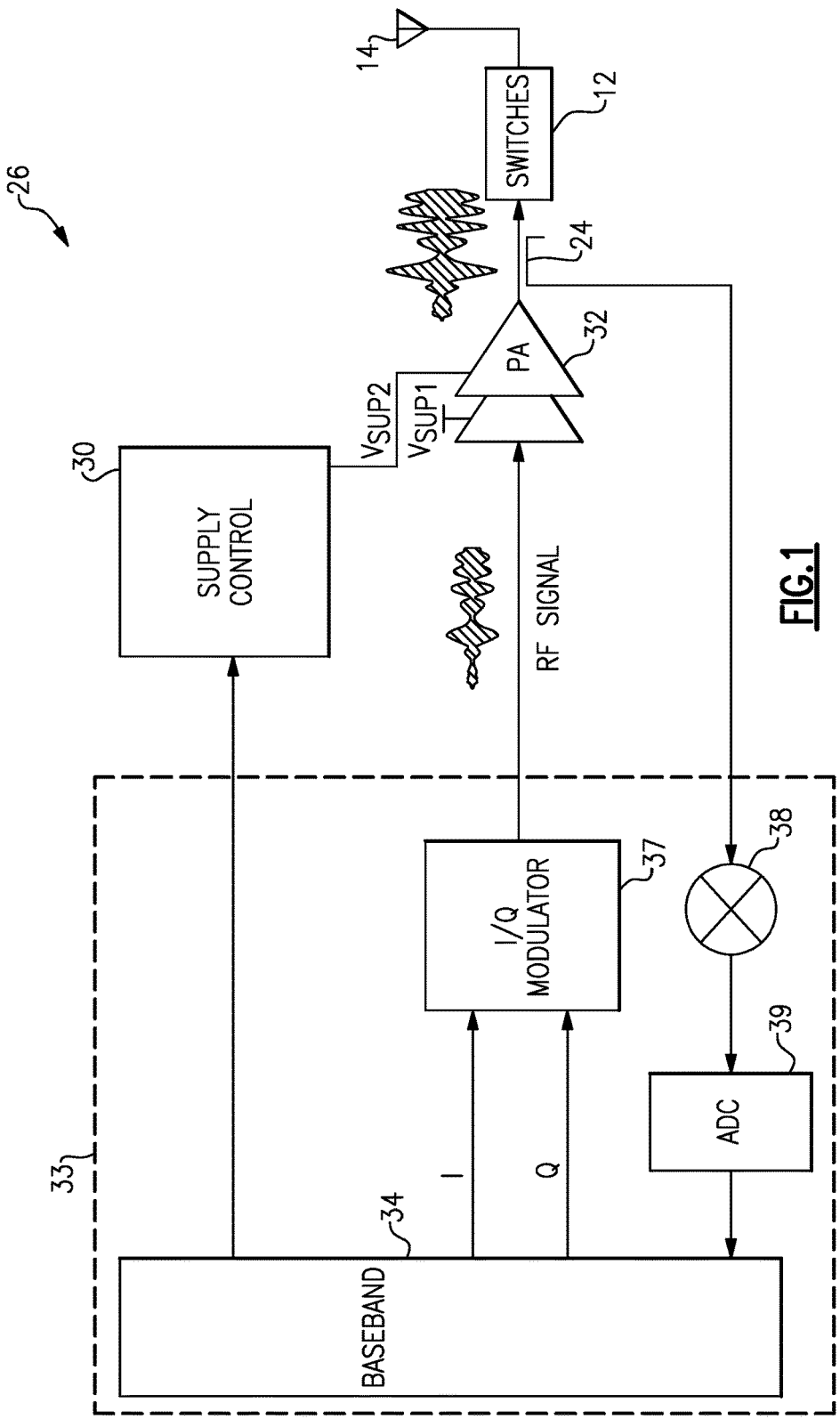
FIG. 1 is a schematic diagram of one example of a power amplifier system.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Certain power amplifiers are operable in multiple power modes. Implementing a power amplifier with multi-mode operation can provide a number of advantages relative to an implementation including a separate power amplifier associated with each power mode. For example, multi-mode power amplifiers can occupy a relatively small chip area. Additionally, multi-mode power amplifiers can avoid complications with matching networks and signal routing associated with using a different power amplifier for each power mode.

In mobile applications, it is important to prolong battery lifetime. One function in mobile applications that consumes a significant amount of battery charge is power amplification.

A supply control circuit can provide a multi-mode power amplifier with a supply voltage that can vary or change depending on a mode of operation of the power amplifier. The mode of operation can be selected to achieve desired performance while increasing efficiency and/or extending battery life. Thus, the supply control circuit can employ various power management techniques to change the voltage level of the supply voltage to improve the power amplifier's power added efficiency (PAE).

One technique for improving power amplifier efficiency is to provide a variable supply voltage with selectable voltage levels based on power mode. For instance, a lower supply voltage can be provided in a lower power mode and a higher supply voltage can be provided in a higher power mode. The multi-mode power amplifier can include any suitable number of supply voltage levels and corresponding power modes, for instance 2 power modes, 3 power modes, or 4 or more power modes.

In certain configurations, a power amplifier includes multiple stages and the supply voltage provided to a final or output stage can be varied depending on the power mode while a different supply voltage for at least one driver stage can remain substantially constant.

When a supply voltage for a power amplifier is reduced in a lower power mode for efficiency purposes, the supply voltage can be significantly lower than for a higher power mode. In one example, the supply voltage for a lower power mode can be about 60% below the supply voltage for a higher mode. However, other supply voltage levels are possible.

Apparatus and methods for power amplifiers with an injection-locked driver stage are provided herein. In certain configurations, a multi-mode power amplifier includes a driver stage implemented using an injection-locked oscillator and an output stage having an adjustable supply voltage that changes based on a mode of the multi-mode power amplifier. By implementing the power amplifier in this manner, the power amplifier exhibits excellent efficiency, including when the voltage level of the adjustable supply voltage is relatively low.

For example, in a low power mode, the adjustable supply voltage used to power the output stage is decreased, and the driver stage has a relatively large impact on the power amplifier's overall efficiency. By implementing the driver stage using an injection-locked oscillator, the overall efficiency of the multi-mode power amplifier is relatively high across different power modes.

The multi-mode power amplifiers discussed herein can exhibit excellent efficiency in a variety of applications, such as applications in which a driver stage operates using a substantially fixed voltage and an output stage operates with large differences in supply voltage across different modes of operation.

The power amplifiers disclosed herein can be implemented using a variety of semiconductor processing technologies, including, but not limited to, semiconductor-on-insulator technology, such as silicon-on-insulator (SOI) technology. Using SOI technology can enable implementation of power amplifiers in a relatively inexpensive and/or reliable manufacturing process. Moreover, desirable performance of low-noise amplifiers (LNAs) and/or radio frequency (RF) switches in SOI technology enables a power amplifier to be implemented as part of a front end integrated circuit (FEIC) that provides transmit, receive, and switching functionality.

FIG. 1 is a schematic diagram of one example of a power amplifier system 26. The illustrated power amplifier system 26 includes a multi-mode power amplifier 32, a supply control circuit 30, switches 12, an antenna 14, a directional coupler 24, and a transmitter 33.

The power amplifier system 26 operates in multiple modes of operation. The multiple modes include at least two different modes of operation in which the supply control circuit 30 provides a supply voltage of different voltage levels to the multi-mode power amplifier 32.

The illustrated transmitter 33 includes a baseband processor 34 an I/Q modulator 37, a mixer 38, and an analog-to-digital converter (ADC) 39. The transmitter 33 can be included in a transceiver that also includes circuitry associated with receiving signals from an antenna (for instance, the antenna 14 or a separate antenna) over one or more receive paths.

The multi-mode power amplifier 32 provides amplification to an RF signal. As shown in FIG. 1, the RF signal can be provided by the I/Q modulator 37 of the transmitter 33. The amplified RF signal generated by the multi-mode power amplifier 32 can be provided to the antenna 14 by way of the switches 12. The multi-mode power amplifier 32 can include a driver stage implemented using an injection-locked oscillator, such as any of the injection-locked oscillator topologies discussed herein.

In certain implementations, the multi-mode power amplifier 32 is implemented using SOI technology. Implementing a power amplifier in this manner aids in integrating the power amplifier with other circuitry, including, for example, the switches 12.

As shown in FIG. 1, the multi-mode power amplifier 32 receives a first supply voltage $V_{SUP1}$ for a driver stage and a second supply voltage $V_{SUP2}$ for an output stage. In the illustrated embodiment, the supply control circuit 30 controls the voltage level of the second supply voltage $V_{SUP2}$ based on a mode signal received from the transmitter 33. In certain configurations, the voltage level of the first supply voltage $V_{SUP1}$ provided to the power amplifier's driver stage is substantially constant across two or more operating modes, but the voltage level of the second supply voltage $V_{SUP2}$ provided to the power amplifier's output stage changes based on the selected operating mode.

The supply control circuit 30 can be any suitable circuit for providing the first supply voltage $V_{SUP1}$ and second supply voltage $V_{SUP2}$ to the multi-mode power amplifier 32. In certain configurations, the supply control circuit 30 includes at least one DC-to-DC converter, such as a buck converter, a boost converter, and/or a buck-boost converter.

In certain configurations, the voltage level of the second supply voltage $V_{SUP2}$ can be significantly lower (e.g., about 60% lower) in one mode of operation relative to another mode of operation. Significant differences in the voltage level of the supply voltage can result in decreased efficiency.

The baseband signal processor 34 can generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can receive the I and Q signals from the baseband processor 34 and to process the I and Q signals to generate an RF signal. For example, the I/Q modulator 37 can include digital-to-analog converters (DACs) configured to convert the I and Q signals into an analog format, mixers for upconverting the I and Q signals to radio frequency, and a signal combiner for combining the upconverted I and Q signals into an RF signal suitable for amplification by the multi-mode power amplifier 32. In certain implementations, the I/Q modulator 37 can include one or more filters configured to filter frequency content of signals processed therein.

In the illustrated power amplifier system 26, the directional coupler 24 is positioned between the output of the multi-mode power amplifier 32 and the input of the switches 12, thereby allowing a measurement of output power of the multi-mode power amplifier 32 that does not include insertion loss of the switches 12. The sensed output signal from the directional coupler 24 can be provided to the mixer 38, which can multiply the sensed output signal by a reference signal of a controlled frequency so as to downshift the frequency content of the sensed output signal to generate a downshifted signal. The downshifted signal can be provided to the ADC 39, which can convert the downshifted signal to a digital format suitable for processing by the baseband processor 34.

By including a feedback path between the output of the multi-mode power amplifier 32 and the baseband processor 34, the baseband processor 34 can be configured to dynamically adjust the I and Q signals to optimize the operation of the power amplifier system 26. For example, configuring the power amplifier system 26 in this manner can aid in providing power control, compensating for transmitter impairments, and/or in performing digital pre-distortion (DPD). Although one example of a sensing path for a power amplifier is shown, other implementations are possible.

Figure 2:
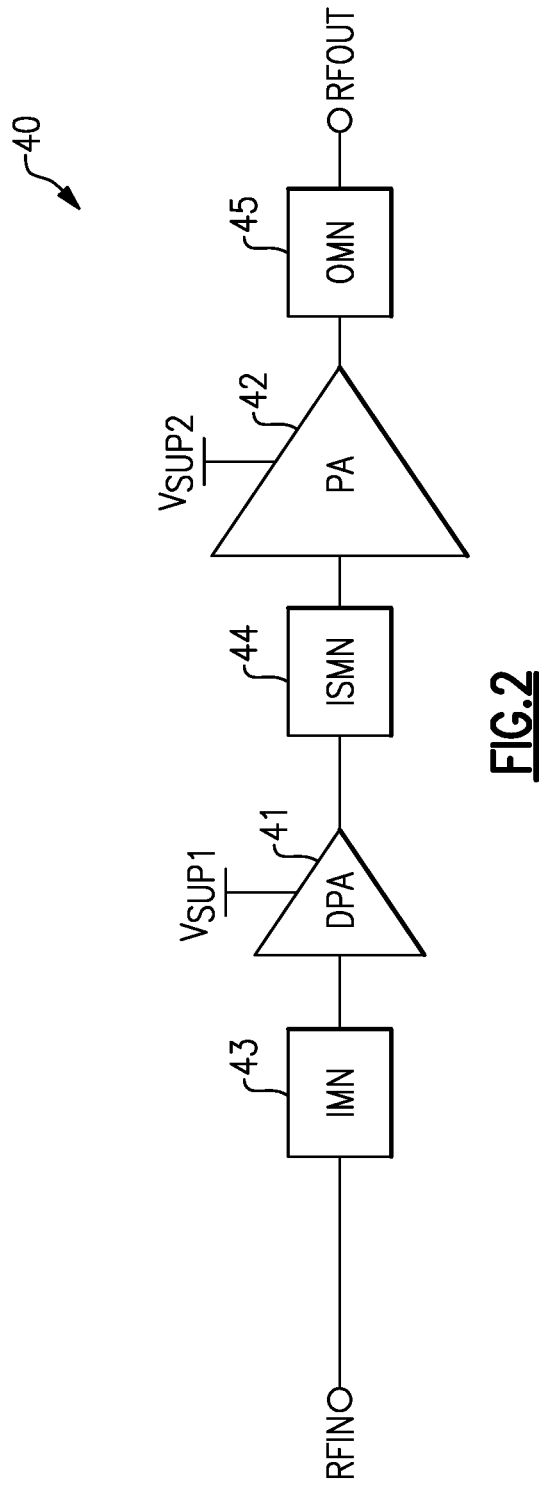
FIG. 2 is a schematic diagram of one example of a multi-mode power amplifier.

FIG. 2 is a schematic diagram of one example of a multi-mode power amplifier 40. The multi-mode power amplifier 40 includes a driver stage 41, an output stage 42, an input matching network 43, an interstage matching network 44, and an output matching network 45.

As shown in FIG. 2, the driver stage 41 is powered by a first supply voltage $V_{SUP1}$ and the output stage 42 is powered by a second supply voltage $V_{SUP2}$. The driver stage 41 receives an RF input signal RFIN via the input matching network 43, and generates an amplified RF signal. The output stage 42 receives the amplified RF signal via the interstage matching network 44, and further amplifies the amplified RF signal to generate an RF output signal RFOUT.

Figure 3A:
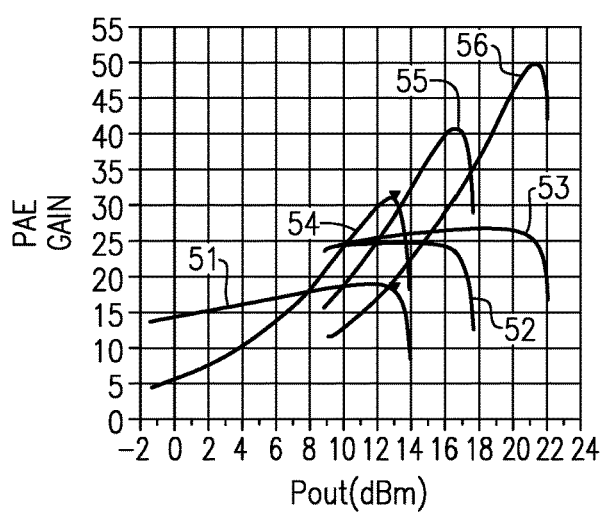
FIGS. 3A-3C show graphs of simulation results for one implementation of the multi-mode power amplifier of FIG. 2.
Figure 3B:
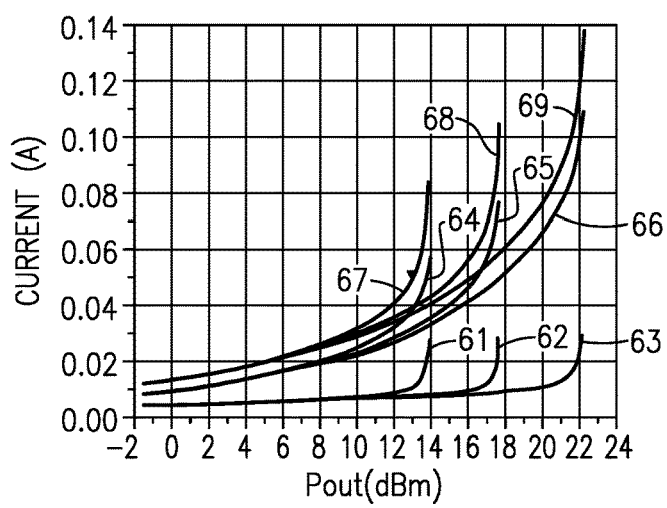
Figure 3C:
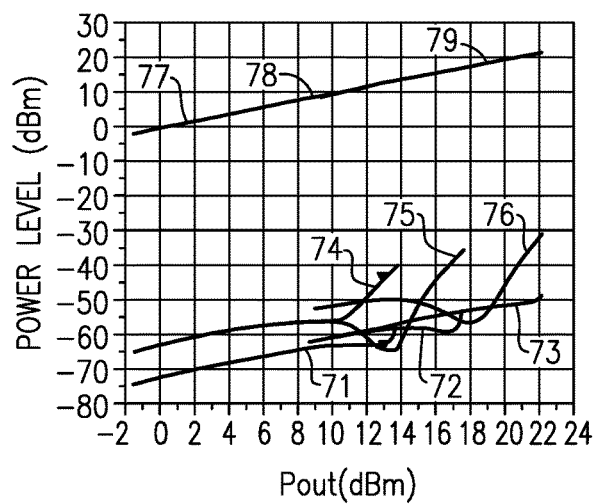

FIGS. 3A-3C show graphs of simulation results for one example of the multi-mode power amplifier of FIG. 2. The graphs include simulation results in a low power mode (13-dBm) in which $V_{SUP1}$ is 1.8 V and $V_{SUP2}$ is 1.2 V, a medium power mode (16-dBm) in which $V_{SUP1}$ is 1.8 V and $V_{SUP2}$ is 1.8 V, and a high power mode (21-dBm) in which $V_{SUP1}$ is 1.8 V and $V_{SUP2}$ is 3.0 V. The driver stage 41 and output stage 42 are each implemented using a common source amplifier with SOI FETs.

Although FIG. 3A-3C illustrate simulation results of a multi-mode power amplifier, lab testing was also performed and yielded similar results.

FIG. 3A shows a graph 50 of power added efficiency (PAE) and gain versus output power. The graph 50 includes a first gain plot 51 for the low power mode, a second gain plot 52 for the medium power mode, and a third gain plot 53 for the high power mode. Additionally, the graph 50 includes a first PAE plot 54 for the low power mode, a second PAE plot 55 for the medium power mode, and a third PAE plot 56 for the high power mode.

FIG. 3B shows a graph 60 of current consumption versus output power. The graph 60 includes a first driver stage current consumption plot 61 for the low power mode, a second driver stage current consumption plot 62 for the medium power mode, and a third driver stage current consumption plot 63 for the high power mode. Additionally, the graph 60 includes a first output stage current consumption plot 64 for the low power mode, a second output stage current consumption plot 65 for the medium power mode, and a third output stage current consumption plot 66 for the high power mode. Furthermore, the graph 60 includes a first total current consumption plot 67 for the low power mode, a second total current consumption plot 68 for the medium power mode, and a third total current consumption plot 69 for the high power mode.

As shown in FIG. 3B, the driver stage and the output stage have a relatively comparable current consumption in the low power mode, which leads to the driver stage having relatively large impact on overall efficiency. Moreover, since the supply voltage of the output stage decreases to about 33% below that of the driver stage in this example, the output stage saturates at a lower output power level. Thus, both power gain and current consumption of the driver stage have a relatively large impact on overall efficiency in the low power mode.

Accordingly, efficiency of the driver stage is important for overall PAE in the low power mode.

FIG. 3C shows a graph 70 of power level versus output power. The graph 70 includes a second harmonic frequency power plot 71 for the low power mode, a second harmonic frequency power plot 72 for the medium power mode, and a second harmonic frequency power plot 73 for the high power mode. Additionally, the graph 70 includes a third harmonic frequency power plot 74 for the low power mode, a third harmonic frequency power plot 75 for the medium power mode, and a third harmonic frequency power plot 76 for the high power mode. Furthermore, the graph 70 includes a fundamental frequency power plot 77 for the low power mode, a fundamental frequency power plot 78 for the medium power mode, and a fundamental frequency power plot 79 for the high power mode.

In certain configurations herein, a multi-mode power amplifier includes a driver stage implemented using an injection-locked oscillator and an output stage having an adjustable supply voltage that changes with a mode of the multi-mode power amplifier. By implementing the power amplifier in this manner, the power amplifier exhibits excellent efficiency, including in a low power mode. For example, in the low power mode, the adjustable supply voltage used to power the output stage is decreased, and the driver stage has a relatively large impact on overall efficiency of the power amplifier. By implementing the driver stage using an injection-locked oscillator, the overall efficiency of the multi-mode power amplifier is relatively high across different modes.

An RF system can include a separate power amplifier die to provide devices having higher efficiency and/or higher breakdown voltages. For example, an RF system can use a Gallium Arsenide (GaAs) die, a Gallium Nitride (GaN) die, or a Silicon Germanium (SiGe) die in which a high impedance loadline provides relatively high voltage swing and relatively low current consumption. However, using a separate power amplifier die can increase the cost of the RF system and/or impact performance of other components of the RF system. For example, it may be desirable to implement the power amplifier in SOI technologies, since RF switches and/or low noise amplifiers (LNAs) can exhibit superior performance when implemented using SOI processes relative to other technologies.

In certain configurations herein, an RF front-end integrated circuit (FEIC) is provided. The RF FEIC is fabricated using an SOI process, and includes at least one LNA, at least one RF switch, and at least one power amplifier. By integrating the power amplifier with the LNA and/or switch, overall cost is reduced. Moreover, the LNA and/or RF switch exhibit superior performance relative to configurations in which the LNA and/or RF switch are fabricated using other processes. The power amplifier can be integrated with the LNA and switch to provide a front-end for an RF transceiver on a single chip.

The multi-mode power amplifiers disclosed herein can provide enhanced performance relative to a single-stage power amplifier that uses an injection-locked oscillator. For example, an injection-locked oscillator includes an inductor-capacitor (LC) resonator or tank that is injection-locked to an RF input signal. When the supply voltage of an injection-locked oscillator is changed with operating mode, the injection-locked oscillator can be detuned. For example, a change to the supply voltage can shift the center frequency of oscillation and/or change the range of frequencies that the oscillator can be injection-locked to. This in turn can make the injection-locked oscillator susceptible to undesired operation such as quasi-lock and/or fast-beat modes.

Accordingly, using an injection-locked oscillator driver stage with a substantially constant supply voltage in combination with a variable supply voltage output stage provides robust performance relative to a single-stage power amplifier that uses an injection-locked oscillator.

Figure 4A:
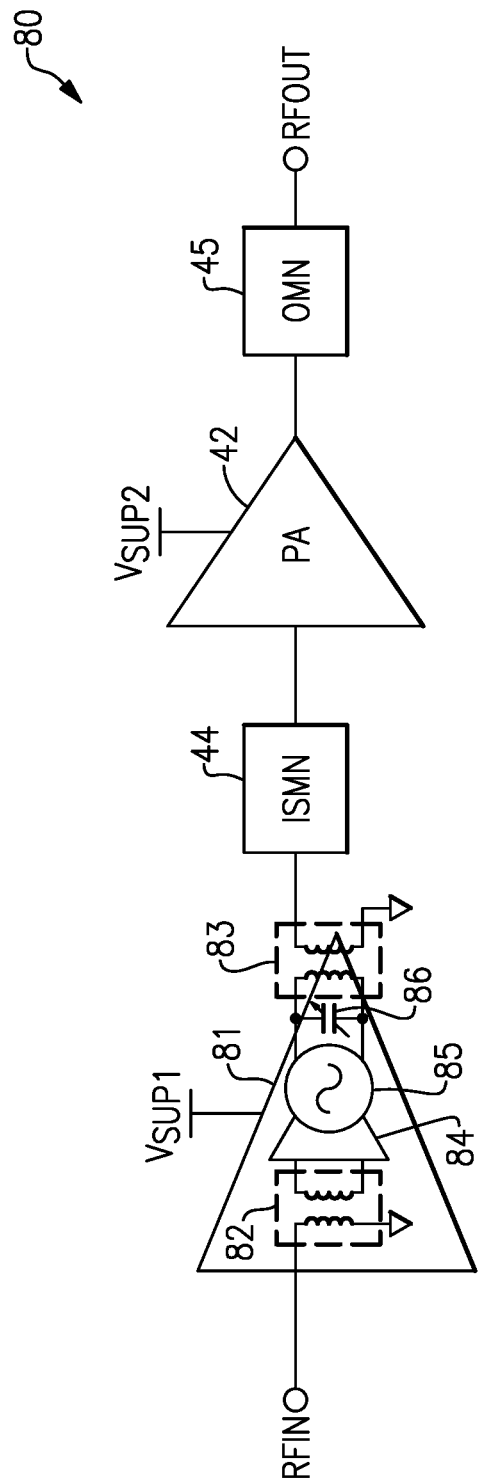
FIG. 4A is a schematic diagram of a multi-mode power amplifier according to one embodiment.

FIG. 4A is a schematic diagram of a multi-mode power amplifier 80 according to one embodiment. The multi-mode power amplifier 80 includes an injection-locked oscillator driver stage 81, an output stage 42, an interstage matching network 44, and an output matching network 45.

The injection-locked oscillator driver stage 81 is powered by a first supply voltage $V_{SUP1}$, and the output stage 42 is powered by a second supply voltage $V_{SUP2}$. The injection-locked oscillator driver stage 81 receives an RF input signal RFIN, and generates an amplified RF signal. The output stage 42 receives the amplified RF signal via the interstage matching network 44, and further amplifies the amplified RF signal to generate an RF output signal RFOUT.

Although the illustrated embodiment includes two stages, the multi-mode power amplifier 80 can include one or more additional stages. For example, the multi-mode power amplifier can include a preceding stage before the injection-locked oscillator driver stage 81 and/or an additional stage included between the injection-locked oscillator driver stage 81 and the output stage 42.

As shown in FIG. 4A, the injection-locked oscillator driver stage 81 includes an input transformer or balun 82, an output transformer or balun 83, a signal injecting circuit 84, a negative transconductance circuit 85, and a capacitor 86. Additionally, the capacitor 86 operates with an inductance of the output transformer 83 in an LC tank or resonator.

The negative transconductance circuit 85 provides energy to maintain the LC tank in resonance. When injection-locked, the LC tank oscillates at a frequency substantially equal to the frequency of the RF input signal RFIN. The output transformer 83 serves to convert a differential signal of the LC tank resonator to a single-ended signal suitable for driving the input to the output stage 42.

Configuring the injection-locked oscillator driver stage 81 to provide differential to single-ended signal conversion reduces or eliminates the impact of output balun loss on overall power amplifier efficiency relative to an implementation including a fully differential output stage.

In certain implementations, the capacitor 86 includes a controllable capacitance component, such as a variable and/or programmable capacitor. Providing controllable capacitance aids in tuning a range of frequencies over which the injection-locked oscillator driver stage 81 can be locked to. In addition to explicit capacitor structures, the capacitor 86 can also include one or more parasitic capacitances, such as parasitic diffusion capacitances of transistors of the negative transconductance circuit 85.

The injection-locked oscillator driver stage 81 operates with very low power consumption relative to driver stages implemented as a common source or common emitter amplifier. During operation, the injection-locked oscillator driver stage 81 is locked in frequency and phase with respect to the RF input signal RFIN, and operates to generate an injection-locked RF signal. In certain configurations, the RF input signal RFIN is a modulated signal having a substantially constant signal envelope.

In the illustrated embodiment, the first supply voltage $V_{SUP1}$ operates with a substantially constant voltage level across operating modes of the multi-mode power amplifier 80. Thus, when the mode of the multi-mode power amplifier 80 changes, the oscillation center frequency and associated locking range of the injection-locked oscillator driver stage 81 remains substantially unchanged. Configuring the multi-mode power amplifier 80 provides robust performance across different operating modes.

In contrast, a multi-mode power amplifier using an injection-locked oscillator in an output stage can become detuned in response to supply voltage changes. For example, the oscillation center frequency and/or tuning range of such an injection-locked oscillator can change in different power modes, thereby degrading performance.

The illustrated injection-locked oscillator driver stage 81 provides a differential-to-single-ended signal conversion operation prior to amplification by the output stage 42.

By implementing differential-to-singled-ended conversion in the injection-locked oscillator driver stage 81, superior power efficiency performance can be achieved. In particular, performing the conversion at a lower signal power level provides higher efficiency relative to performing the conversion at a higher signal power level. For instance, a loss of L dB due to signal conversion has a larger impact at the output of the output stage 42 relative to the same amount of loss at the input of the output stage 42.

The output stage 42 can be implemented in a wide variety of ways. In a first example, the output stage 42 is implemented as a common source amplifier including an NMOS transistor having a gate that receives an input signal, a source electrically connected to a ground voltage, and a drain that generates the RF output signal RFOUT. In a second example, the output stage 42 is implemented as a cascode amplifier including a stack of two or more NMOS transistors, and the input signal is provided to a gate of the bottommost transistor in the stack and the output signal is provided from a drain of the uppermost transistor in the stack.

Although various examples of the output stage 42 have been described, the output stage 42 can be implemented in a wide variety of ways, including, but not limited to, implementations using bipolar transistors or implementations using a combination of field-effect transistors and bipolar transistors.

The interstage matching network 44 provides impedance matching between the output of the driver stage 81 and an input to the output stage 42. Additionally, the output matching network 45 provides output impedance matching to the output stage 42. In certain implementations, the interstage matching network 44 and/or the output matching network 45 provide harmonic termination, DC biasing, and/or aid in achieved a desired loadline impedance.

Including the interstage matching network 44 and the output matching network 45 increase power transfer relative to a configuration in which the impedance matching networks are omitted. The impedance matching networks can be implemented in a wide variety of ways.

In the illustrated embodiment, the input transformer or balun 82 serves at least in part to provide input impedance matching, thereby reducing component count and/or area. However, other implementations are possible.

Additional details of the multi-stage amplifier 80 can be as described herein.

Figure 4B:
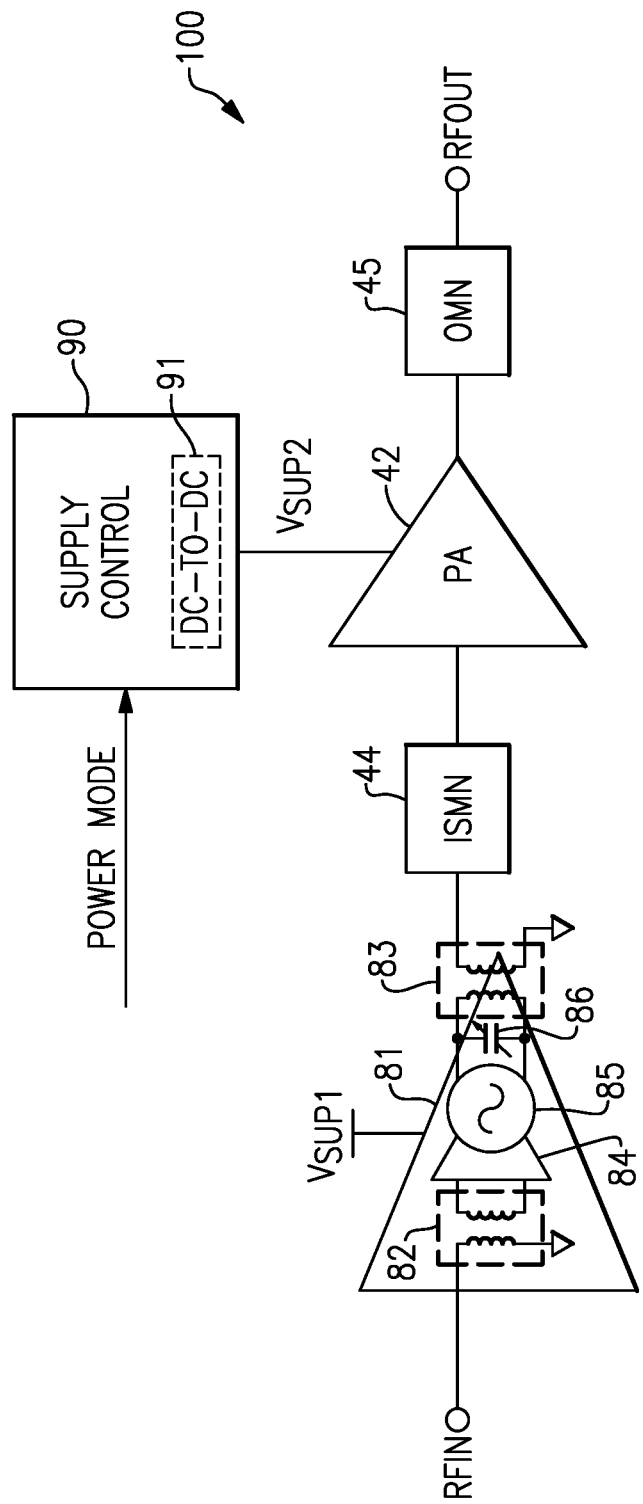
FIG. 4B is a schematic diagram of a multi-mode power amplifier according to another embodiment.

FIG. 4B is a schematic diagram of a multi-mode power amplifier 100 according to another embodiment. The multi-mode power amplifier 100 of FIG. 4B is similar to the multi-mode power amplifier 80 of FIG. 4A, except that the multi-mode power amplifier 100 of FIG. 4B includes a supply control circuit 90 that controls a voltage level of the second supply voltage $V_{SUP2}$ based on a power mode signal. In the illustrated embodiment, the supply control circuit 90 includes a DC-to-DC converter 91 for efficiently regulating the second supply voltage $V_{SUP2}$ to a desired voltage level.

Figure 5:
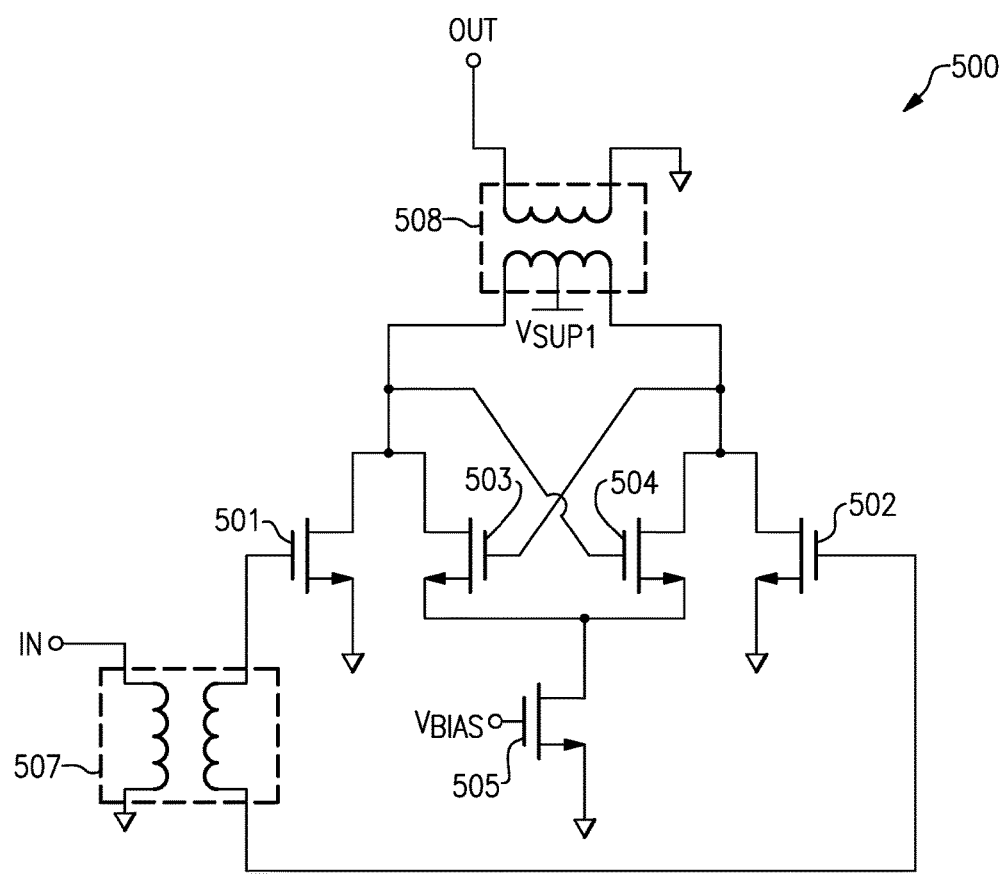
FIG. 5 is a schematic diagram of an injection-locked oscillator driver stage according to one embodiment.

FIG. 5 is a schematic diagram of an injection-locked oscillator driver stage 500 according to one embodiment. The injection-locked oscillator driver stage 500 includes an input transformer or balun 507, an output transformer or balun 508, a first signal injecting n-type metal oxide semiconductor (NMOS) transistor 501, a second signal injecting NMOS transistor 502, a first negative transconductance NMOS transistor 503, a second negative transconductance NMOS transistor 504, and a bias NMOS transistor 505.

As shown in FIG. 5, the injection-locked oscillator driver stage 500 receives a single-ended RF input signal IN and generates a single-ended RF output signal OUT. Additionally, the injection-locked oscillator driver stage 500 is powered using the first supply voltage $V_{SUP1}$. In the illustrated embodiment, the first supply voltage $V_{SUP1}$ is provided to a center tap of a first winding of the output transformer 508.

The first and second negative transconductance NMOS transistors 503, 504 are cross-coupled with one another, and operate as a negative transconductance circuit. The first winding of the output transformer 508 is electrically connected between the drain of the first negative transconductance NMOS transistor 503 and the drain of the second negative transconductance NMOS transistor 504.

The output transformer 508 serves to convert a differential-ended signal corresponding to a voltage difference between the drains of the negative transconductance NMOS transistors 503, 504 to the single-ended injection-locked RF output signal OUT. In the illustrated embodiment, the singled-ended injection-locked RF output signal OUT is generated by a second winding of the output transformer 508, and is referenced to a ground voltage.

The injection-locked oscillator driver stage 500 includes an LC tank associated with the inductance of the output transformer 508 and a parasitic capacitance at the drains of the negative transconductance NMOS transistors 503, 504. In certain implementations, the LC tank of the injection-locked oscillator driver stage 500 further includes an explicit capacitor, such as controllable capacitance component to provide tuning range.

The bias NMOS transistor 505 controls a bias current of the negative transconductance NMOS transistors 503, 504 and the LC tank's oscillation amplitude.

In the illustrated embodiment, the gate of the bias NMOS transistor 505 receives a bias voltage $V_{BIAS}$, which controls the amount of bias current of the negative transconductance NMOS transistors 503, 504. In certain implementations, the bias voltage $V_{BIAS}$ is controllable, such as by digital programming via an IC interface (for instance, a MIPI RFFE bus or I$^2$C bus). The bias voltage $V_{BIAS}$ can be provided to the gate of the bias NMOS transistor 505 through a resistive feed to aid in providing isolation to circuitry that generates the bias voltage $V_{BIAS}$, which can be generated using any suitable bias circuitry.

The negative transconductance NMOS transistors 503, 504 provide energy to the LC tank to maintain oscillations. When the RF input signal IN is not present, the oscillation frequency of the LC tank resonator can be about equal to the LC tank's resonant frequency.

The input transformer 507 serves to convert the single-ended RF input signal IN to a differential signal provided to the gates of the signal injecting NMOS transistors 501, 502. As shown in FIG. 5, the drains of the first and second signal injecting NMOS transistors 501, 502 are electrically connected to the drains of the first and second negative transconductance NMOS transistors 503, 504, respectively. When the RF input signal IN is sufficiently large, the signal injecting NMOS transistors 501, 502 provide sufficient signal injection to lock the oscillation frequency and phase of the LC oscillator to the frequency of the RF input signal IN.

The injection-locked oscillator driver stage 500 illustrates one embodiment of a driver stage that can be used in the multi-mode power amplifiers described herein. However, an injection-locked oscillator driver stage can be implemented in other ways.

Additional details of the injection-locked oscillator driver stage 500 can be as described herein.

Figure 6A:
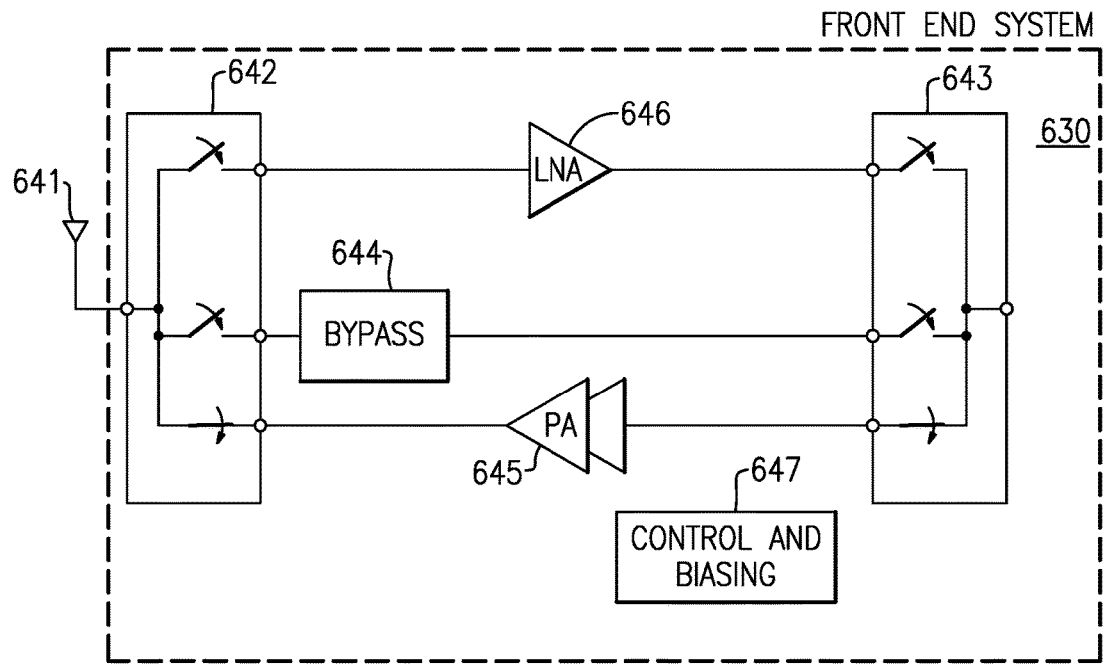
FIG. 6A is a schematic diagram of a front end system according to one embodiment.
Figure 6B:
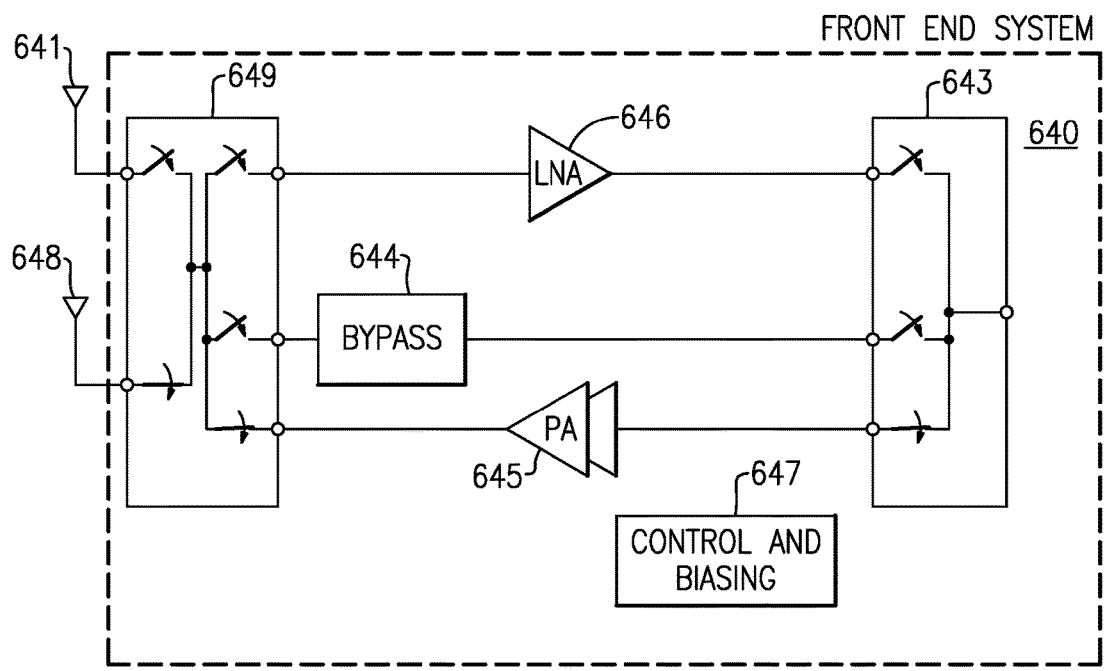
FIG. 6B is a schematic diagram of a front end system according to another embodiment.

FIG. 6A is a schematic diagram of a front end system 630 according to one embodiment. FIG. 6B is a schematic diagram of a front end system 640 according to another embodiment.

An RF front end system can include circuits in a signal path between an antennas and a baseband system. Some RF front ends can include circuits in signal paths between one or more antennas and a mixer configured to modulate a signal to RF or to demodulate an RF signal.

The front end systems of 6A and 6B can be implemented in a packaged module. Such packaged modules can include relatively low cost laminate based front end modules that combine power amplifiers with low noise amplifiers and/or switch functions. Some such packaged modules can be multi-chip modules. In certain implementations, some or the all of the illustrated components in any of the front end systems in FIGS. 6A and/or 6B can be embodied on a single integrated circuit or die. Such a die can be manufactured using any suitable process technology. As one example, the die can be a semiconductor-on-insulator die, such as a silicon-on-insulator (SOI) die. According to some implementations, one or more antennas can be integrated with any of the front end systems discussed herein.

With reference to FIG. 6A, the RF front end system 630 is configured to receive RF signals from an antenna 641 and to transmit RF signals by way of the antenna 641. The illustrated front end system 630 includes a first multi-throw switch 642, a second multi-throw switch 643, a receive signal path that includes an LNA 646, a bypass signal path that includes a bypass network 644, and a transmit signal path that includes a multi-mode power amplifier 645. The low noise amplifier 646 can be implemented by any suitable low noise amplifier. The bypass network 644 can include any suitable network for matching and/or bypassing the receive signal path and the transmit signal path. The bypass network 644 can be implemented by a passive impedance network or by a conductive trace or wire. The multi-mode power amplifier 645 includes an injection-locked oscillator driver stage. The multi-mode power amplifier 645 can be implemented in accordance with any of the principles and advantages discussed herein.

The first multi-throw switch 642 can selectively connect a particular signal path to the antenna 641. The first multi-throw switch 642 can electrically connect the transmit signal path to the antenna 641 in a first state, electrically connect the receive signal path to the antenna 641 in a second state, and electrically connect the bypass signal path to the antenna 641 in a third state. The second multi-throw switch 643 can selectively connect a particular signal path to an input/output port of the front end system 630, in which the particular signal path is the same signal path electrically connected to the antenna 641 by way of the first multi-throw switch 642. Accordingly, the second multi-throw switch 643 together with the first multi-throw switch 642 can selectively connect a particular signal path between the antenna 641 and the input/output port of the front end system 630.

The control and biasing circuit 647 can be used to control and bias circuitry of the RF front end system 630. In certain configurations, the control and biasing circuit 647 receives a mode signal indicating a mode of operation of the multi-mode power amplifier 645. The mode signal can be provided to the control and biasing circuit 647 in a variety of ways, such as over a serial interface (for instance, a MIPI RFFE bus or I$^2$C bus). The control and biasing circuit 647 can use the mode signal for a variety of purposes, including, for example, controlling a voltage level of a supply voltage used to power an output stage of the multi-mode power amplifier 645.

The RF front end system 640 of FIG. 6B is similar to the RF front end system 630 of FIG. 6A, except that the first multi-throw switch 649 is configured to selectively connect a particular signal path to either a first antenna 641 or a second antenna 648. The multi-throw switch 649 can be a multi-throw, multi-pole switch.

Figure 7A:
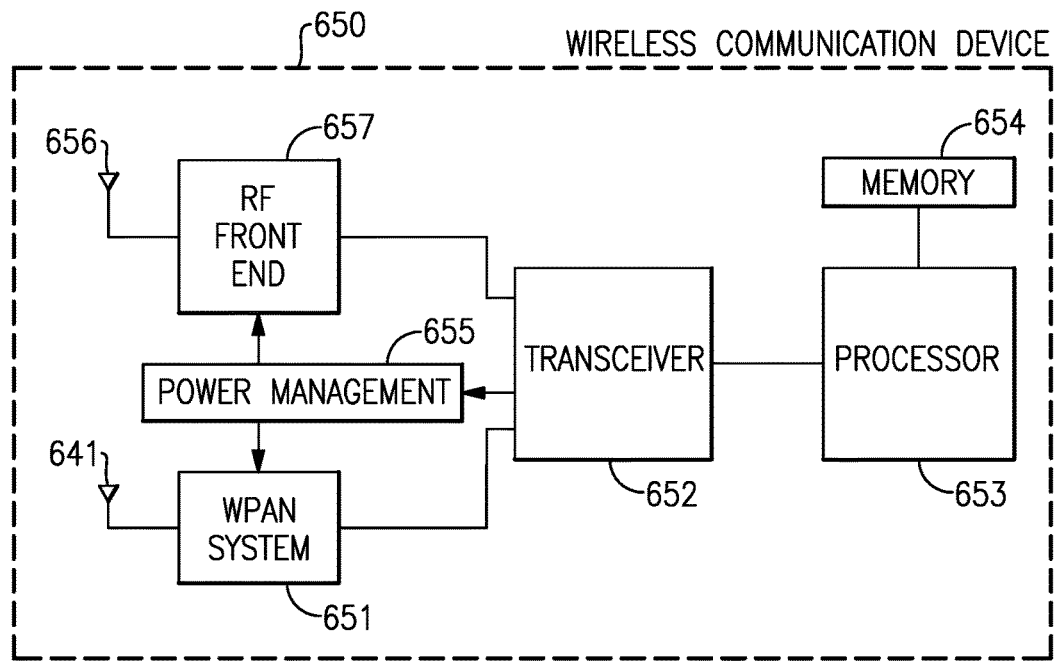
FIG. 7A is a schematic diagram of a wireless communication device according to one embodiment.
Figure 7B:
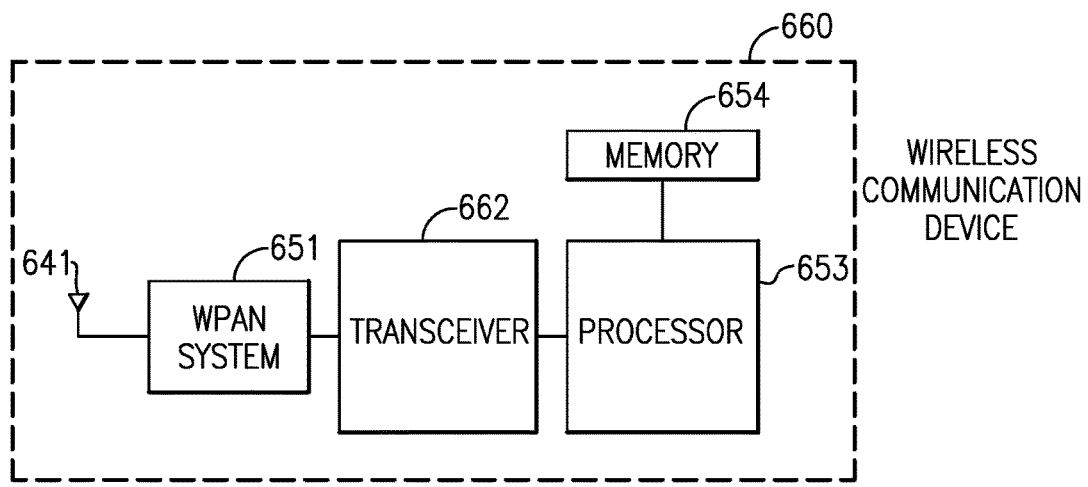
FIG. 7B is a schematic diagram of a wireless communication device according to another embodiment.

FIG. 7A is a schematic diagram of a wireless communication device 650 according to one embodiment. FIG. 7B is a schematic diagram of a wireless communication device 660 according to another embodiment.

FIGS. 7A and 7B are schematic block diagrams of illustrative wireless communication devices that include a power amplifier and/or a front end system in accordance with one or more embodiments. The wireless communication device 650 can be any suitable wireless communication device. For instance, this device can be a mobile phone, such as a smart phone.

As illustrated, the wireless communication device 650 includes a first antenna 641, a wireless personal area network (WPAN) system 651, a transceiver 652, a processor 653, a memory 654, a power management circuit 655, a second antenna 656, and an RF front end system 657. Any of the power amplifiers discussed herein can be implemented in the WPAN system 651 and/or the RF front end system 657. The WPAN system 651 is an RF front end system configured for processing RF signals associated with personal area networks (PANs). The WPAN system 651 can be configured to transmit and receive signals associated with one or more WPAN communication standards, such as signals associated with one or more of Bluetooth, ZigBee, Z-Wave, Wireless USB, INSTEON, IrDA, or Body Area Network. In another embodiment, a wireless communication device can include a wireless local area network (WLAN) system in place of the illustrated WPAN system, and the WLAN system can process Wi-Fi signals.

The illustrated wireless communication device 660 of FIG. 7B is a device configured to communicate over a PAN. This wireless communication device can be relatively less complex than the wireless communication device 650 of FIG. 7A. As illustrated, the wireless communication device 660 includes an antenna 641, a WPAN system 651, a transceiver 662, a processor 653, and a memory 654. The WPAN system 660 can include a power amplifier in accordance with any of the principles and advantages discussed herein.

Figure 8A:
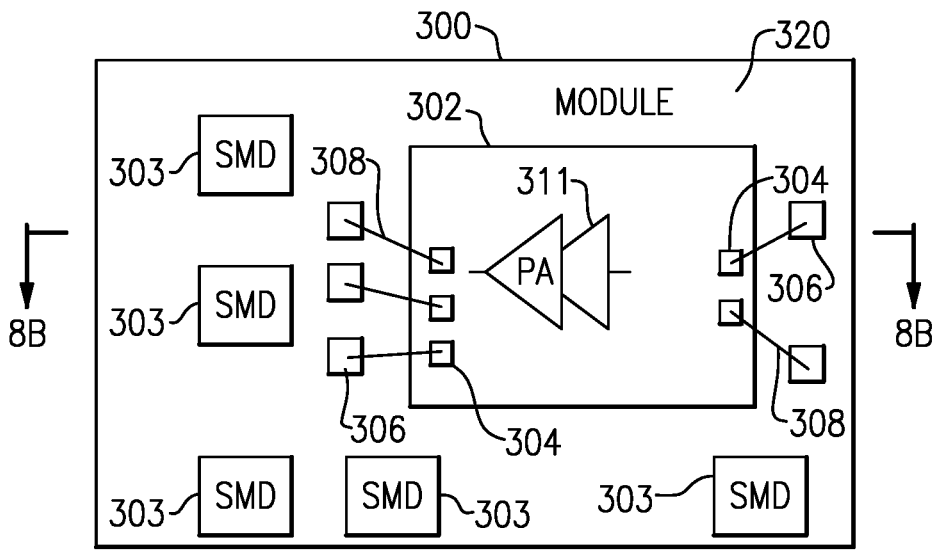
FIG. 8A is a schematic diagram of one embodiment of a packaged module.
Figure 8B:
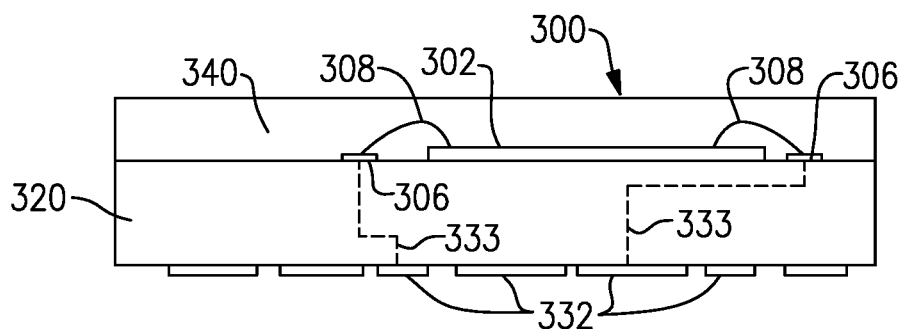
FIG. 8B is a schematic diagram of a cross-section of the packaged module of FIG. 8A taken along the lines 8B-8B.

FIG. 8A is a schematic diagram of one embodiment of a packaged module 300. FIG. 8B is a schematic diagram of a cross-section of the packaged module 300 of FIG. 8A taken along the lines 8B-8B.

The packaged module 300 includes a semiconductor die 302, surface mount devices (SMDs) 303, wirebonds 308, a package substrate 320, and an encapsulation structure 340. The package substrate 320 includes pads 306 formed from conductors disposed therein. Additionally, the semiconductor die 302 includes pins or pads 304, and the wirebonds 308 have been used to connect the pads 304 of the die 302 to the pads 306 of the package substrate 320.

The semiconductor die 302 includes a multi-mode power amplifier 311 implemented in accordance with one or more features of the present disclosure. In certain implementations, the semiconductor die 302 further includes an LNA and switches such that the packaged module 300 operates as a front-end module.

The packaging substrate 320 can be configured to receive a plurality of components such as the semiconductor die 302 and the surface mount devices 303, which can include, for example, surface mount capacitors and/or inductors.

In certain implementations, one or more of the surface mount devices 303 operate in an output matching network (OMN) for the multi-mode power amplifier 311.

As shown in FIG. 8B, the packaged module 300 is shown to include a plurality of contact pads 332 disposed on the side of the packaged module 300 opposite the side used to mount the semiconductor die 302. Configuring the packaged module 300 in this manner can aid in connecting the packaged module 300 to a circuit board, such as a phone board of a wireless device. The example contact pads 332 can be configured to provide radio frequency signals, bias signals, and/or power (for example, a power supply voltage and ground) to the semiconductor die 302 and/or the surface mount devices 303. As shown in FIG. 7B, the electrical connections between the contact pads 332 and the semiconductor die 302 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 9:
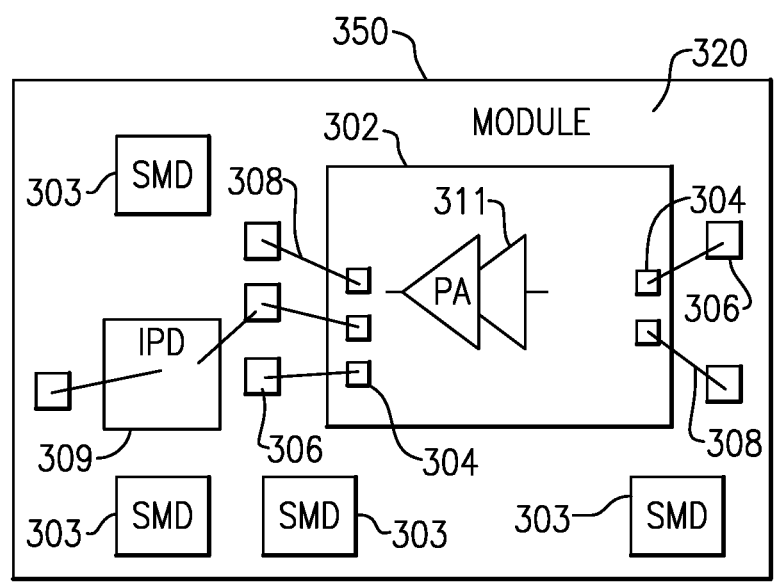
FIG. 9 is a schematic diagram of another embodiment of a packaged module.

FIG. 9 is a schematic diagram of another embodiment of a packaged module 350. The packaged module 350 of FIG. 9 is similar to the packaged module 300 of FIGS. 8A-8B, except that the packaged module 350 of FIG. 9 further includes an integrated passive device (IPD) 309. The IPD 309 can be used to provide high quality-factor (Q-factor) and/or high performance passive components.

In certain implementations, the IPD 309 operates in an OMN for the multi-mode power amplifier 311.

Figure 10A:
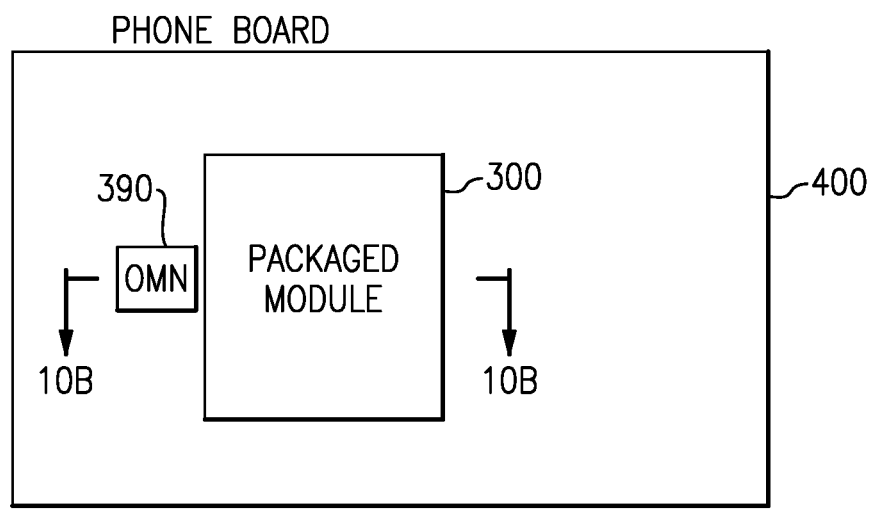
FIG. 10A is a schematic diagram of one embodiment of a phone board.
Figure 10B:
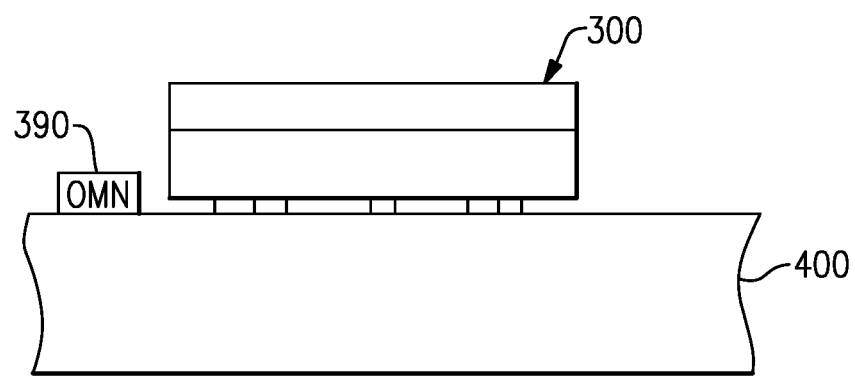
FIG. 10B is a schematic diagram of a cross-section of the phone board of FIG. 10A taken along the lines 10B-10B.

FIG. 10A is a schematic diagram of one embodiment of a phone board 400. FIG. 10B is a schematic diagram of a cross-section of the phone board 400 of FIG. 10A taken along the lines 10B-10B.

As shown in FIGS. 10A and 10B, the phone board 400 includes the packaged module 300 attached thereto. Connecting the packaged module 300 in this manner facilitates communication with other electronics on the phone board 400.

In the illustrated phone board 400 includes OMN components 390 attached to the phone board 400. In certain implementations, all of part of an OMN for a multi-mode power amplifier is implemented on a phone board.

Applications

Some of the embodiments described above have provided examples in connection with power amplifiers, front end modules and/or wireless communications devices. However, the principles and advantages of the embodiments can be used for any other systems or apparatus that have needs for power amplifiers.

For example, power amplifiers can be included in various electronic devices, including, but not limited to consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A multi-mode power amplifier comprising:
   a driver stage including an injection-locked oscillator configured to receive a radio frequency input signal and to generate an injection-locked radio frequency signal;
   an output stage configured to amplify the injection-locked radio frequency signal to generate a radio frequency output signal, the output stage configured to receive power from an adjustable supply voltage; and
   a supply control circuit configured to control a voltage level of the adjustable supply voltage based on a mode of the multi-mode power amplifier.

2. The multi-mode power amplifier of claim 1 wherein the injection-locked oscillator includes an output balun configured to provide a differential to singled-ended signal conversion.

3. The multi-mode power amplifier of claim 1 wherein the driver stage is powered by a substantially fixed supply voltage.

4. The multi-mode power amplifier of claim 3 wherein the mode of the multi-mode power amplifier is selectable between two or more power modes including a high power mode in which the adjustable supply voltage is greater than the substantially fixed supply voltage and a low power mode in which the adjustable supply voltage is less than the substantially fixed supply voltage.

5. The multi-mode power amplifier of claim 1 wherein the radio frequency input signal is a modulated signal having a substantially constant signal envelope.

6. The multi-mode power amplifier of claim 1 wherein the radio frequency input signal is a single-ended input signal, and the injection-locked oscillator includes an input transformer configured to convert the single-ended input signal to a differential input signal.

7. The multi-mode power amplifier of claim 1 wherein the injection-locked oscillator includes a negative transconductance circuit electrically connected to an inductor-capacitor tank, the negative transconductance circuit configured to provide energy to the inductor-capacitor tank to maintain oscillations.

8. The multi-mode power amplifier of claim 7 wherein the negative transconductance circuit includes a pair of cross-coupled field-effect transistors.

9. The multi-mode power amplifier of claim 7 wherein the injection-locked oscillator further includes a signal injecting circuit configured to provide signal injection to the inductor-capacitor tank based on the radio frequency input signal.

10. A method of radio frequency signal amplification, the method comprising:
    generating an injection-locked radio frequency signal from a radio frequency input signal using an injection-locked oscillator of a multi-mode power amplifier;
    amplifying the injection-locked radio frequency signal using an output stage of the multi-mode power amplifier;
    powering the output stage using an adjustable supply voltage; and
    controlling a voltage level of the adjustable supply voltage based on a mode of the multi-mode power amplifier using a supply control circuit.

11. The method of claim 10 further comprising providing a differential to singled-ended signal conversion at an output of the driver stage using an output balun.

12. The method of claim 10 further comprising powering the driver stage using a substantially fixed supply voltage.

13. The method of claim 10 further comprising providing a modulated signal having a substantially constant signal envelope to an input of the driver stage.

14. The method of claim 10 further comprising injection locking an inductor-capacitor tank of the injection-locked oscillator to the radio frequency input signal.

15. The method of claim 14 further comprising providing energy to the inductor-capacitor tank to maintain oscillations using a negative transconductance circuit.

16. A packaged module comprising:
a package substrate; and
a semiconductor die attached to the package substrate, the semiconductor die including a multi-mode power amplifier including a driver stage including an injection-locked oscillator configured to receive a radio frequency input signal and to generate an injection-locked radio frequency signal, and an output stage configured to amplify the injection-locked radio frequency signal to generate a radio frequency output signal, the output stage configured to receive power from an adjustable supply voltage having a voltage level that changes based on a mode of the multi-mode power amplifier.

17. The packaged module of claim 16 wherein the semiconductor die further includes a low noise amplifier and a switch electrically connected to the low noise amplifier and to the multi-mode power amplifier.

18. The packaged module of claim 16 wherein the injection-locked oscillator includes a negative transconductance circuit electrically connected to an inductor-capacitor tank, the negative transconductance circuit configured to provide energy to the inductor-capacitor tank to maintain oscillations.

19. The packaged module of claim 18 wherein the injection-locked oscillator further includes a signal injecting circuit configured to provide signal injection to the inductor-capacitor tank based on the radio frequency input signal.

20. The packaged module of claim 16 wherein the semiconductor die is a silicon-on-insulator die.

* * * * *